US012066332B2

(12) United States Patent
Pelenc et al.

(10) Patent No.: US 12,066,332 B2
(45) Date of Patent: Aug. 20, 2024

(54) PROCESS FOR PRODUCING A MICROBOLOMETER COMPRISING A VANADIUM-OXIDE-BASED SENSITIVE MATERIAL

(71) Applicant: COMMISSARIAT À L'ENERGIE ATOMIQUE ET AUX ENERGIES ALTERNATIVES, Paris (FR)

(72) Inventors: Denis Pelenc, Grenoble (FR); Giacomo Badano, Grenoble (FR); Alexi Cardoso, Veurey-Voroize (FR); Marc Guillaumont, Veurey-Voroize (FR)

(73) Assignees: COMMISSARIAT À L'ENERGIE ATOMIQUE ET AUX ENERGIES ALTERNATIVES, Paris (FR); LYNRED, Palaiseau (FR)

( * ) Notice: Subject to any disclaimer, the term of this patent is extended or adjusted under 35 U.S.C. 154(b) by 220 days.

(21) Appl. No.: 17/629,995

(22) PCT Filed: Jul. 27, 2020

(86) PCT No.: PCT/EP2020/071170
§ 371 (c)(1),
(2) Date: Jan. 25, 2022

(87) PCT Pub. No.: WO2021/018856
PCT Pub. Date: Feb. 4, 2021

(65) Prior Publication Data
US 2022/0252456 A1 Aug. 11, 2022

(30) Foreign Application Priority Data
Jul. 30, 2019 (FR) ...................................... 19 08688

(51) Int. Cl.
*G01J 5/04* (2006.01)
*G01J 5/20* (2006.01)
*H10N 15/10* (2023.01)

(52) U.S. Cl.
CPC ............... *G01J 5/046* (2013.01); *G01J 5/045* (2013.01); *G01J 5/20* (2013.01); *H10N 15/15* (2023.02)

(58) Field of Classification Search
None
See application file for complete search history.

(56) References Cited

U.S. PATENT DOCUMENTS 8,329,002 B1 * 12/2012 Githinji ............... C23C 14/0042
204/192.21
11,193,833 B2 * 12/2021 Pelenc .................... G01J 5/046
(Continued)

FOREIGN PATENT DOCUMENTS

KR 10-1439263 B1 9/2014
WO WO 2011/096012 A1 8/2011

OTHER PUBLICATIONS

International Search Report mailed on Oct. 6, 2020 in PCT/EP2020/071170 filed on Jul. 27, 2020 (2 pages).
(Continued)

*Primary Examiner* — Marcus H Taningco
(74) *Attorney, Agent, or Firm* — Oblon, McClelland, Maier & Neustadt, L.L.P.

(57) ABSTRACT

A process for producing a microbolometer including a vanadium-oxide-based sensitive material containing an additional chemical element chosen from arsenic, germanium, silicon and phosphorus, the process including: determining an effective amount of the additional chemical element from which the modified compound, having undergone a step of exposure to a temperature $T_r$ for a time $\Delta t_r$, exhibits an electrical resistivity $\rho_{a|r}$ at room temperature that
(Continued)

is higher than 10% of its native value; producing the sensitive material in a thin layer, this material being formed from the modified compound having an amount of the additional chemical element that is greater than or equal to the effective amount; and exposing the sensitive material to the temperature $T_r$ for the time $\Delta t_r$.

20 Claims, 5 Drawing Sheets

(56) References Cited

U.S. PATENT DOCUMENTS

| | | | | |
|---|---|---|---|---|
| 2005/0167592 | A1* | 8/2005 | Moon | G01J 5/20 250/338.1 |
| 2011/0303847 | A1* | 12/2011 | Kurashina | G01J 5/023 250/338.4 |
| 2011/0315981 | A1* | 12/2011 | Xu | G01J 5/046 438/54 |
| 2014/0159032 | A1 | 6/2014 | Syllaios et al. | |
| 2015/0192473 | A1* | 7/2015 | Pelenc | G01J 5/24 427/101 |
| 2016/0273968 | A1* | 9/2016 | Novotny | G01J 5/045 |
| 2017/0137281 | A1* | 5/2017 | Favier | H01L 23/564 |
| 2018/0021561 | A1* | 1/2018 | Nelson | A61B 5/150992 600/573 |
| 2021/0010868 | A1* | 1/2021 | Pelenc | G01J 5/20 |

OTHER PUBLICATIONS

Jin, "Reactive Sputter Deposition of Vanadium, Nickel, and Molybdenum Oxide Thin Films for Use in Uncooled Infrared Imaging", A Dissertation in Engineering Science, Dec. 2014, 150 total pages.

Cadieux, "Microstructure Et Propriétés Électriques De L'oxyde De Vanadium Pour Les Microbolomètres", Mémoire Présenté En Vue De L'obtention Du Diplôme Demaîtrise És Sciences Appliquées (Génie Physique), Apr. 2014, 182 total pages (with partial translation).

* cited by examiner

PROCESS FOR PRODUCING A MICROBOLOMETER COMPRISING A VANADIUM-OXIDE-BASED SENSITIVE MATERIAL

CROSS-REFERENCE TO RELATED APPLICATIONS

The present application is the national stage of international application PCT/EP2020/071170, filed on Jul. 27, 2020, and claims the benefit of the filing date of French Appl. No. 1 908 688, filed on Jul. 30, 2019.

NAMES OF THE PARTIES TO A JOINT RESEARCH AGREEMENT

The subject matter claimed in the present application was invented under a joint research agreement between COMMISSARIAT A L'ENERGIE ATOMIQUE ET AUX ENERGIES ALTERNATIVES and LYNRED. The joint research agreement was in effect on or before the effective filing date of the claimed invention, i.e., Jul. 30, 2019, and the claimed invention was made as a result of activities undertaken within the scope of the joint research agreement.

TECHNICAL FIELD

The field of the invention is that of devices for detecting electromagnetic radiation, for example infrared or terahertz electromagnetic radiation, comprising at least one resistive thermal detector comprising a sensitive material based on vanadium oxide. The invention is applicable notably to the field of infrared imaging and thermography.

PRIOR ART

An electromagnetic radiation detection device may comprise an array of resistive thermal detectors, also called microbolometers, each microbolometer comprising an absorbent portion capable of absorbing the electromagnetic radiation to be detected.

In order to thermally insulate the sensitive material of the microbolometers, the absorbent portions are usually in the form of membranes suspended above the substrate by anchoring pillars, and are thermally insulated therefrom by holding and thermal insulation arms. These anchoring pillars and thermal insulation arms also have an electrical function by electrically connecting the suspended membranes to a read circuit that is generally arranged in the substrate.

The absorbent membrane comprises a sensitive material whose electrical resistivity $\rho$ varies as a function of the temperature of the material. The sensitive material is characterized by the value $\rho_a$ of the electrical resistivity at ambient temperature and by its coefficient $\alpha$ (or TCR), which is defined by the relationship $\alpha = 1/\rho \times d\rho/dT$. The sensitive material may be a semiconductor material usually chosen from among amorphous silicon and a vanadium oxide $VO_x$.

The choice of the sensitive material depends notably on its compatibility with the conventional deposition and etching steps usually used in microelectronics, and notably in silicon technology. However, it appears that a sensitive material based on vanadium oxide is likely to have its electrical properties degraded following the microbolometer manufacturing process.

DISCLOSURE OF THE INVENTION

The aim of the invention is to at least partly remedy the drawbacks of the prior art, and more particularly to propose a process for manufacturing at least one microbolometer comprising a sensitive material based on vanadium oxide whose electrical properties are preserved during the manufacturing process, and more precisely whose risks of 1/f noise degradation of the sensitive material, following the manufacturing process, are limited or even eliminated.

To this end, the subject of the invention is a process for manufacturing at least one microbolometer comprising a sensitive material, the process allowing noise degradation associated with said sensitive material to be limited. The sensitive material is formed: of a first compound based on vanadium oxide ($VO_x$); and of at least one additional chemical element added to said first compound and chosen from among arsenic (As), germanium (Ge), silicon (Si), and phosphorus (P), with the exception of nitrogen (N). The process includes the following steps:
  a step of producing said sensitive material in a thin layer;
  a step of exposing the sensitive material to a temperature $T_r$ greater than the ambient temperature for a duration $\Delta t_r$, performed after the step of producing the sensitive material, the temperature $T_r$ and the duration $\Delta t_r$ being such that said first compound, being amorphous and having a native electrical resistivity value at ambient temperature of between 1 $\Omega \cdot$cm and 30 $\Omega \cdot$cm, having undergone a step of exposure to the temperature $T_r$ for the duration $\Delta t_r$, has an electrical resistivity at ambient temperature less than or equal to 10% of its native value.

The process further comprises the following steps:
  determining a non-zero what is called effective amount of the additional chemical element (As, Ge, Si, P) added to said first compound ($VO_x$), thus forming a modified compound, starting from which the modified compound, having undergone a step of exposure to the temperature $T_r$ for the duration $\Delta t_r$, has an electrical resistivity $\rho_{a|r}$ at ambient temperature greater than 10% of its native value $\rho_a$;
  in said step of producing the sensitive material in a thin layer, the latter is formed of said modified compound having an amount of the additional chemical element (As, Ge, Si, P) greater than or equal to the effective amount determined beforehand, the sensitive material being amorphous, having a native electrical resistivity value $\rho_a$ at ambient temperature of between 0.1 $\Omega \cdot$cm and 30 $\Omega \cdot$cm, and a homogeneous chemical composition;
  such that, following said step of exposing the sensitive material to the temperature $T_r$ for the duration $\Delta t_r$, said sensitive material then has a noise whose degradation has been limited.

Certain preferred but non-limiting aspects of this manufacturing process are as follows.

The additional chemical element is preferably chosen from among arsenic, germanium and silicon, and is preferably arsenic.

The step of exposing the sensitive material may comprise a step of depositing a protective layer covering the sensitive material.

The step of exposing the sensitive material may comprise a step of depositing an encapsulation layer transparent to the electromagnetic radiation to be detected and intended to define a cavity in which the microbolometer is located.

The temperature $T_r$ is preferably greater than or equal to 330° C., or even equal to 350° C. to within 5° C.

The duration $\Delta t_r$ is preferably greater than or equal to 90 min.

The sensitive material is preferably produced at a temperature less than the temperature $T_r$.

The invention also relates to a microbolometer comprising a sensitive material formed: of a first compound based on vanadium oxide (VO$_x$); and of at least one additional chemical element chosen from among arsenic, germanium, silicon and phosphorus, with the exception of nitrogen. The sensitive material is amorphous; has an electrical resistivity at ambient temperature of between 0.1 Ω·cm and 30 Ω·cm; has a homogeneous chemical composition; and comprises an amount of the additional chemical element, defined as the ratio of the number of atoms of the additional chemical element to that of vanadium, at least equal to 0.012 in the case of arsenic, at least equal to 0.04 in the case of germanium and silicon, and at least equal to 0.12 in the case of phosphorus.

The amount of oxygen, defined as the ratio of the number of oxygen atoms to that of vanadium, may be between 1.42 and 1.94, to within plus or minus 0.05.

The sensitive material may be covered by a protective layer of silicon nitride.

The invention also relates to a device for detecting electromagnetic radiation, comprising an array of microbolometers according to any one of the preceding features, the microbolometers being arranged in at least one hermetic cavity delimited by an encapsulation structure transparent to the electromagnetic radiation to be detected, the encapsulation structure comprising at least one layer made of amorphous silicon.

The detection device may comprise a getter material located in the hermetic cavity.

BRIEF DESCRIPTION OF THE DRAWINGS

Other aspects, aims, advantages and features of the invention will become more clearly apparent on reading the following detailed description of preferred embodiments thereof, this description being given by way of non-limiting example and with reference to the appended drawings, in which.

DETAILED DISCLOSURE OF PARTICULAR EMBODIMENTS

In the figures and in the remainder of the description, the same references represent identical or similar elements. In addition, the various elements are not shown to scale so as to improve the clarity of the figures. Moreover, the various embodiments and variants are not mutually exclusive and may be combined with one another. Unless indicated otherwise, the terms "substantially", "approximately", "of the order of" mean to within 10%, and preferably to within 5%, and, with regard to temperatures, to within 10° C. and preferably to within 5° C. Moreover, the expression "comprising a" should be understood to mean "comprising at least one", unless indicated otherwise.

The indications relating to the chemical composition of a compound are expressed by its empirical chemical formula, conventionally expressed with respect to one (1) vanadium atom. Thus, for a compound VO$_x$As$_y$, mentioned here purely by way of illustration, the value x of the amount of oxygen is the number of oxygen atoms per 1 vanadium atom, and the value y of the amount of arsenic is the number of arsenic atoms per 1 vanadium atom. The value of the amount of the chemical element is given to within 10%. Moreover, the atomic percentage of each chemical element in the compound VO$_x$As$_y$ is 1/(1+x+y) for vanadium, x/(1+x+y) for oxygen, and y/(1+x+y) for arsenic.

The invention relates notably to a process for manufacturing at least one resistive thermal detector, also called a microbolometer, comprising a sensitive material based on vanadium oxide VO$_x$. The microbolometer may be designed to detect infrared or terahertz radiation. The sensitive material comprises a non-zero sufficient amount of at least one additional chemical element chosen from among arsenic As, germanium Ge, silicon Si and phosphorus P, with the exception of nitrogen N, allowing the thermal stability of the sensitive material to be improved. In the remainder of the description, "base compound" refers to a VO$_x$-based compound not containing the additional chemical element, and "modified compound" refers to the base compound to which the additional chemical element has been added.

The manufacturing process implements at least one step in which the sensitive material is exposed to a temperature greater than ambient temperature, and less than or equal to a temperature $T_r$, for a duration less than or equal to $\Delta t_r$, for example to 330° C. or to 350° C., or even to 390° C., for 10 min, 30 min, or even 90 min or more. The thermal exposure temperature $T_r$ is therefore higher than the ambient temperature.

This thermal exposure step may correspond to the deposition, at approximately 330° C., of a protective layer, for example made of a silicon nitride SiN or a silicon oxide SiO, covering the sensitive material in order to protect it from any subsequent contamination by chemical elements that are possibly present. It may also correspond to producing an encapsulation layer of amorphous silicon, said layer being intended to define a hermetic cavity in which the microbolometer is located. It may also involve activating, at approximately 330° C., a getter material located in the hermetic cavity, this getter material being intended to react with residual gas possibly present in the cavity in order to keep same at a sufficient vacuum level.

These examples are given by way of illustration. The step of thermal exposure to the temperature $T_r$ for the duration $\Delta t_r$ may generally be implemented within the framework of technological steps for manufacturing the microbolometer that are performed after the sensitive material has been produced, or even within the framework of technological steps for manufacturing the detection device after the microbolometer or microbolometers has/have been produced, in particular in order to integrate additional functionalities in the detection chip.

Figure 1A:
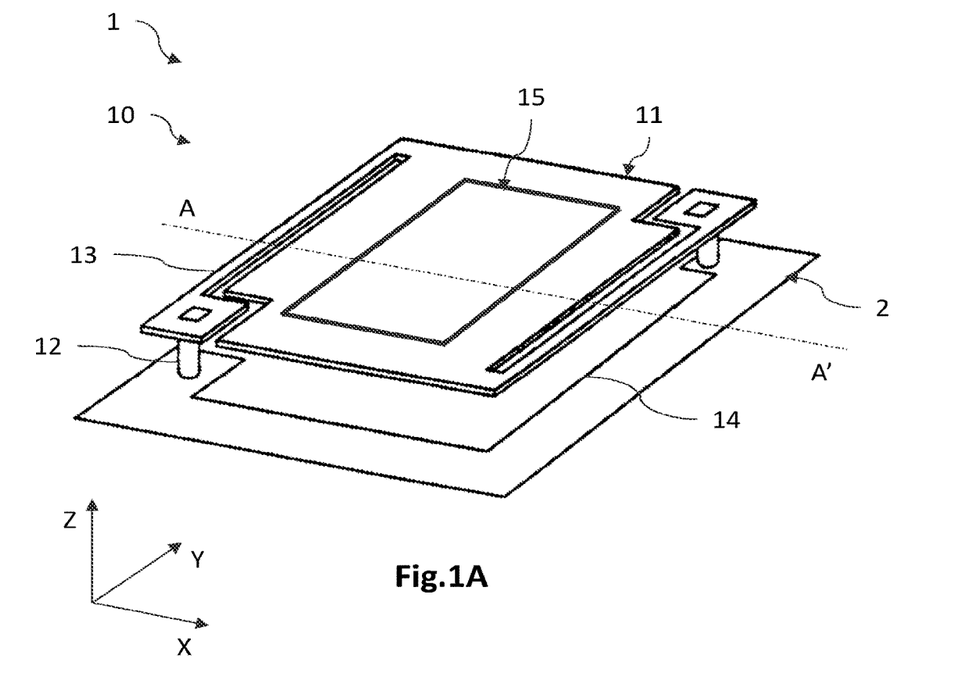
FIGS. 1A and 1B are schematic and partial views, respectively in perspective and in section along the plane A-A', of a microbolometer according to one embodiment, comprising a sensitive material based on vanadium oxide.
Figure 1B:
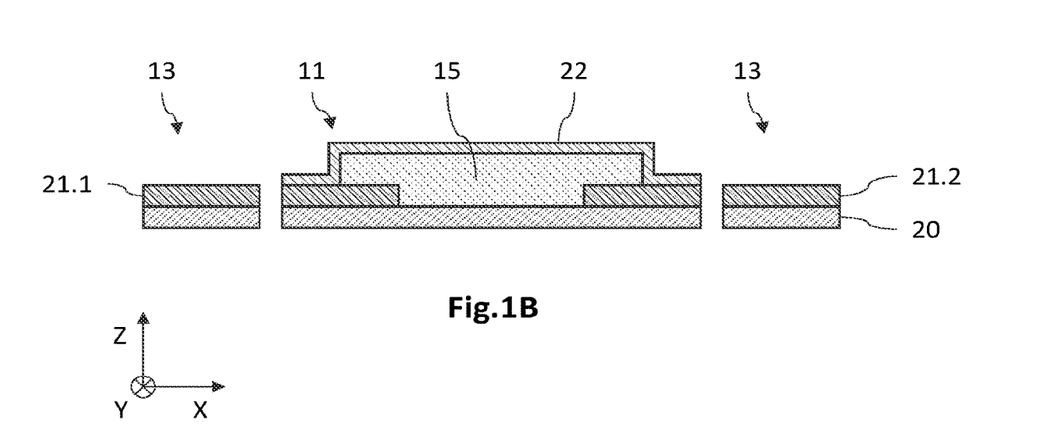

FIGS. 1A and 1B are schematic and partial views, respectively in perspective and in section along the plane A-A', of a microbolometer 10 of a device 1 for detecting electromagnetic radiation, the microbolometer 10 comprising a sensitive material 15 based on vanadium oxide $VO_x$.

The microbolometer 10 comprises an absorbent membrane 11 containing sensitive material 15 based on vanadium oxide $VO_x$, suspended above a substrate 2 by anchoring pillars 12 and thermal insulation arms 13, as well as an electronic control and read circuit (not shown) located in the substrate 2. The microbolometer 10 is designed here to absorb infrared radiation contained within the long wavelength infrared (called LWIR) band, ranging from approximately 8 μm to 14 μm.

Here and for the remainder of the description, a direct three-dimensional orthogonal reference system (X, Y, Z) is defined, where the plane XY is substantially parallel to the plane of a substrate 2, the Z-axis being oriented in a direction substantially orthogonal to the plane of the substrate 2. Moreover, the terms "lower" and "upper" are understood to relate to an increasing position when moving away from the substrate 2 in the direction +Z.

The microbolometer 10 comprises a substrate 2 based in this example on silicon, comprising an electronic circuit (not shown) allowing the microbolometer to be controlled and read. The electronic circuit comprises portions of conductive lines, for example made of metal, separated from one another by a dielectric material, for example a silicon-based mineral material such as a silicon oxide SiO, a silicon nitride SiN, or alloys thereof. To this end, it may comprise active electronic elements, for example diodes, transistors, capacitors, resistors, etc., connected by electrical interconnections to the microbolometer 10, on the one hand, and to an interconnection pad (not shown), on the other hand, the latter being intended to electrically connect the detection device 1 to an external electronic device.

The upper face of the substrate 2 may be covered with a protective layer (not shown), notably when the absorbent membrane is produced on a mineral sacrificial layer, which is then eliminated through a chemical attack with an acid medium. It may cover or be covered by a reflective layer 14 arranged under the absorbent membrane 11. When it covers the reflective layer 14, it is made of a material that is at least partially transparent to the electromagnetic radiation to be detected. The protective layer has an etch stop function, and is designed to protect the substrate and the inter-metal dielectric layers, when they are made of a mineral material, against a chemical attack, for example a chemical attack with an HF (hydrofluoric acid) acid medium implemented subsequently in order to etch the mineral sacrificial layer used in the production of the absorbent membrane. This protective layer thus forms a hermetic and chemically inert layer. It is electrically insulating so as to avoid any short circuit between the metal line portions. It may thus be made of alumina $Al_2O_3$, or even of aluminium nitride or fluoride. It may have a thickness of between a few ten and a few hundred nanometers, for example of between 10 nm and 500 nm, preferably of between 10 nm and 30 nm.

The microbolometer 10 comprises an absorbent membrane 11 incorporating a sensitive material 15 based on vanadium oxide $VO_x$, suspended above the substrate 2 by anchoring pillars 12 and thermal insulation arms 13. The anchoring pillars 12 are electrically conductive, and locally pass through the protective layer in order to create electrical contact with the electronic circuit. The absorbent membrane 11 is spaced from the substrate 2, and in particular from the reflective layer 14, by a non-zero distance. This distance is preferably adjusted so as to form a quarter-wave cavity optimizing the absorption of the electromagnetic radiation to be detected by the suspended membrane 11.

As illustrated in FIG. 1B, the absorbent membrane 11 may comprise a lower support layer 20 made of an electrically insulating material on which there rest two electrodes 21.1, 21.2 that are distinct from one another and made for example of TiN, which exhibits good absorption of infrared radiation. A thin layer of the sensitive material 15 rests on the support layer 20 and comes into contact with each of the two electrodes 21.1, 21.2. The sensitive material 15 is in this case covered with a protective layer 22, made for example of a silicon nitride SiN or a silicon oxide SiO, which makes it possible to avoid any subsequent contamination of the sensitive material 15. This example is given purely by way of illustration, and other arrangements of the electrodes and of the sensitive material are possible.

Moreover, the microbolometer 10 may be located in a hermetic cavity defined by an encapsulation structure (not shown), as described in particular in the publication by Dumont et al. entitled *Current progress on pixel level packaging for uncooled IRFPA*, SPIE Proceedings Vol. 8353 (2012). The encapsulation structure may be formed by a stack of various thin layers, such as an encapsulation layer for example made of amorphous silicon deposited by CVD or iPVD, covered with a sealing and anti-reflective layer, for example made from various sub-layers of germanium and zinc sulfide, deposited for example by EBPVD, IBS or the like. Such an encapsulation structure is described notably in patent application EP3067675.

The sensitive material 15 is based on vanadium oxide $VO_x$, that is to say that it is formed of what is called a base compound made from a vanadium oxide $VO_x$ to which an additional chemical element chosen from among arsenic, germanium, silicon, and phosphorus, with the exception of nitrogen, has been added. The sensitive material 15 therefore does not contain nitrogen: the amount of nitrogen in the sensitive material 15 is therefore zero or virtually zero, that is to say is less than or equal to 0.1% by atomic percentage. An additional chemical element is a chemical element intentionally added to the base compound, that is to say the vanadium oxide. The sensitive material 15 is amorphous, that is to say that it contains substantially no crystalline phases. Moreover, it has an electrical resistivity of between 0.1 Ω·cm and 30 Ω·cm, which corresponds for example to an amount of oxygen x, defined as the ratio between the number of oxygen atoms and the number of vanadium atoms, of between 1.42 and 1.94 to within plus or minus 0.05. More precisely, the base compound has an electrical resistivity of between 1 Ω·cm and 30 Ω·cm. The modified compound, corresponding to the base compound to which the additional chemical element has been added, has an electrical resistivity of between 0.1 Ω·cm and 30 Ω·cm. The amount x of oxygen is identical in the base compound and the modified compound. In addition, it has a homogeneous chemical composition, that is to say that its chemical composition as defined in an elementary volume of the order of 3 nm in diameter is invariant on a large scale (in at least 90%, 95% or even 99% of its volume).

The base compound is amorphous and is based on $VO_x$, with x being between 1.42 and 1.94, to within plus or minus 0.05, and preferably being between 1.56 and 1.94, to within 0.05. It does not have a stoichiometric form. It is thus distinguished from stoichiometric compounds such as $VO_2$, $V_2O_5$, $V_3O_5$. As stated above, the compound with the empirical chemical formula $V_2O_5$ in this case has 5 oxygen atoms per 2 vanadium atoms (x=5/2), and the compound $V_3O_5$ has 5 oxygen atoms per 3 vanadium atoms (x=5/3). It will be noted here that the stoichiometric compound $V_3O_5$ is a compound that cannot be obtained under the usual production conditions for such a microbolometer $VO_x$ base compound (temperature usually less than the maximum thermal budget of the read circuit located in the substrate 2, that is to say less than 400° C.). Therefore, the $VO_x$ sensitive material according to the invention may have an amount x equal to 1.67 without however corresponding to the stoichiometric form $V_3O_5$. Moreover, with regard to the $V_2O_3$ stoichiometric compound, there is virtually zero probability that such a base compound, that is to say that is amorphous and having an electrical resistivity of between approximately 1 Ω·cm and 30 Ω·cm, will be able to form a single $V_2O_3$ stoichiometric crystalline phase after annealing at the temperature $T_r$. Therefore, even for an amorphous base compound having an amount of oxygen of about 1.5, therefore to within 0.05, several stoichiometric crystalline phases that differ in terms of their amount of oxygen are therefore likely to be formed after annealing at $T_r$, including the $V_2O_3$ crystalline phase. Whatever the case, if the amount of oxygen of the amorphous base compound is between 1.56 and 1.94, to within 0.05, a single $V_2O_3$ stoichiometric crystalline phase cannot form after annealing at $T_r$. It will moreover be noted that, if the base compound or the sensitive material has an amount of oxygen x of between 1.56 and 1.94, to within 0.05, the native electrical resistivity is then between approximately 2 Ω·cm and 30 Ω·cm.

The sensitive material 15 then corresponds to a modified compound, that is to say that it corresponds to the base compound that has been modified by the addition of at least one additional chemical element chosen from among arsenic As, germanium Ge, silicon Si and phosphorus P. As described further below, it is preferably chosen from among arsenic, germanium and silicon, and is preferably arsenic.

The amount of additional chemical element, specifically the number of arsenic As, germanium Ge, silicon Si or phosphorus P atoms to that of vanadium, is chosen so as to give the sensitive material, which has been exposed to the temperature $T_r$ for the duration $\Delta t_r$, an improved thermal stability, more precisely an electrical resistivity $\rho_{a|r}$ at ambient temperature greater than 10% of its native value $\rho_a$, and preferably greater than or equal to 50% of its native value. At least equal is understood to mean greater or equal. The native value $\rho_a$ of the electrical resistivity is that of the sensitive material before it has been exposed to the temperature $T_r$ for $\Delta t_r$.

The values of the temperature $T_r$ and of the duration $\Delta t_r$ are such that the first compound based on $VO_x$ (therefore without the additional chemical element) has an electrical resistivity at ambient temperature less than or equal to 10% of its native value. These are values of the temperature and the duration of the thermal exposure to which the sensitive material 15 might be subjected in the subsequent steps of manufacturing the microbolometer.

The amount of additional chemical element (As, Ge, Si and/or P) is then greater than or equal to what is called an effective value, called an effective amount. The effective amount is the minimum, non-zero, amount of the additional chemical element (As, Ge, Si and/or P) starting from which the sensitive material, having undergone a step of exposure to the temperature $T_r$ for the duration $\Delta t_r$, has an electrical resistivity $\rho_{a|r}$ at ambient temperature greater than 10% of the native value $\rho_a$ of said sensitive material at ambient temperature, and preferably greater than or equal to 50% of the native value $\rho_a$. The ambient temperature may be equal to 30° C. The temperature $T_r$ is greater than the ambient temperature, and is preferably greater than or equal to 330° C., and preferably greater than or equal to 350° C. It may be less than or equal to 400° C. The duration $\Delta t_r$ is preferably greater than or equal to a few minutes or tens of minutes, or even a few hours.

In other words, when the sensitive material, the amount of the additional chemical element (As, Ge, Si and/or P) in which is greater than or equal to the effective amount, has not been exposed to the temperature $T_r$ for the duration $\Delta t_r$, its electrical resistivity at ambient temperature has the native value $\rho_a$. After thermal exposure to $T_r$ for $\Delta t_r$, the sensitive material then has an electrical resistivity $\rho_{a|r}$ at ambient temperature greater than 10% of the native value $\rho_a$ and preferably greater than or equal to 50% of the native value $\rho_a$.

The effective amount depends notably on the base compound under consideration, as well as on the chosen values of the temperature $T_r$ and of the duration $\Delta t_r$ of the thermal exposure. A person skilled in the art is able to determine the effective amount, that is to say the minimum amount of the additional chemical element (As, Ge, Si and/or P), to be added to the base compound so that the sensitive material has an electrical resistance $\rho_{a|r}$ at ambient temperature greater than 10% of the native value $\rho_a$. The effective amount may be chosen, if necessary, such that the value $\rho_{a|r}$ is greater than 10%, for example at least equal to 50%, or even at least equal to 90% of the native value $\rho_a$.

The electrical resistivity at ambient temperature of the sensitive material may be determined using a conventional four-point measurement technique, and the atomic composition of the sensitive material, and therefore the amount of the additional chemical element, may notably be determined by NRA (Nuclear Reaction Analysis), by RBS (Rutherford Backscattering Spectroscopy), by SIMS (Secondary Ion Mass Spectrometry), by XPS (X-ray Photoelectron Spectroscopy), using suitable standards.

It is known that the electrical resistivity at ambient temperature of a sensitive material consisting of vanadium oxide $VO_x$ may drop in value when it has been exposed to a temperature of 300° C. or 400° C., in particular under an inert atmosphere (under nitrogen), as described in the publication by Venkatasubramanian et al. entitled *Correlation of temperature response and structure of annealed $VO_x$ thin films for IR detector applications*, J. Vac. Sci. Technol. A 27(4), 2009, 956-961. Thus, a sensitive material consisting of vanadium oxide, and therefore without an additional chemical element such as arsenic, germanium, silicon and phosphorus, has an electrical resistivity $\rho_{a|r}$ at ambient temperature of the same order of magnitude as its native value $\rho_a$ after exposure to a temperature of the order of 200° C. under an inert atmosphere. However, the electrical resistivity $\rho_{a|r}$ drops by an order of magnitude, or even several orders of magnitude, when the sensitive material has been exposed to a temperature of 300° C. or 400° C. for 10 min or 30 min under an inert atmosphere.

However, the inventors have found that the addition, to a sensitive material based on vanadium oxide, of a sufficient amount of an additional chemical element chosen from among arsenic, germanium, silicon and phosphorus, surprisingly makes it possible to improve the thermal stability of the sensitive material during thermal exposure to high temperatures, for example of the order of 330° C. or even more, for several tens of minutes, and more precisely to limit or even eliminate possible 1/f noise degradation of the sensitive material following the thermal exposure step.

The sensitive material based on vanadium oxide, with addition of a sufficient amount of the additional chemical element (As, Ge, Si and/or P), then has an electrical resistivity $\rho_{a|r}$ at ambient temperature greater than 10% of the native value $\rho_a$. The effective amount added to the first compound made of $VO_x$ is an amount greater than or equal to the determined effective amount. Such a sensitive material then does not exhibit significant degradation of its electrical properties, and notably does not exhibit significant degradation of its electrical resistivity at ambient temperature or of its 1/f noise, following the microbolometer manufacturing process which includes at least one step of exposing the sensitive material to at most $T_r$ for at most $\Delta t_r$, such as steps of depositing thin layers, of encapsulating the microbolometer in a hermetic cavity, or even of activating a getter material.

More precisely, it may be seen that exposing a compound based on $VO_x$, when it is amorphous and has a native electrical resistivity $\rho_a$ at ambient temperature of between 1 $\Omega$·cm and 30 $\Omega$·cm, to a temperature $T_r$ for a duration $\Delta t_r$ such that its electrical resistivity $\rho_{a|r}$ is at least less than 50% of its native value $\rho_a$, also causes a degradation of 1/f noise, without the TCR coefficient otherwise being affected. It is recalled that 1/f noise, also called flicker noise or low-frequency noise, stems in particular from fluctuations in the mobility and/or density of free carriers.

Moreover, an amorphous compound based on a vanadium oxide $VO_x$, for which the electrical resistivity is between 1 $\Omega$·cm and 30 $\Omega$·cm, is not likely to form a single stoichiometric crystalline phase, after annealing at $T_r$, under the usual conditions for producing such a $VO_x$ base compound of a microbolometer (temperature less than 400° C.). In such an electrical resistivity range, the base compound has an amount of oxygen x of the order of approximately 1.42 to 1.94. Approximately is understood to mean here that the absolute uncertainty is ±0.05. As indicated above, the electrical resistivity of the base compound may be between 2 $\Omega$·cm and 30 $\Omega$·cm, its amount of oxygen x then being between 1.56 and 1.94, to within 0.05.

The inventors have found that the evolution of the 1/f noise of such a base compound as a function of the thermal exposure temperature $T_r$ for a given duration $\Delta t_r$ is correlated with that of the electrical resistivity, but is not correlated with that of the TCR coefficient.

Figure 2A:
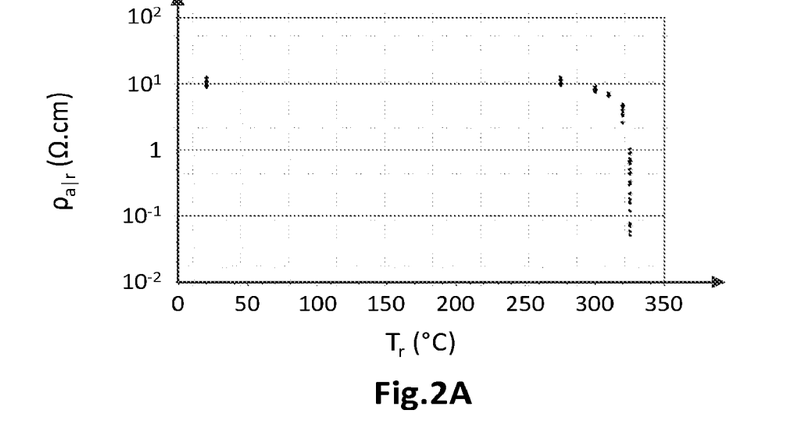
FIGS. 2A to 2C illustrate, respectively:
an example of the evolution of the electrical resistivity at ambient temperature of a base compound produced from vanadium oxide (called first compound), not containing an additional chemical element chosen from among arsenic, germanium, silicon and phosphorus, as a function of a thermal exposure temperature $T_r$;
an example of values of the TCR coefficient for VO$_x$ base compounds as a function of their electrical resistivity, without thermal exposure, and after thermal exposure to 310° C. for 90 min;
an example of values of a parameter representative of the 1/f noise for VO$_x$ base compounds as a function of their electrical resistivity, without thermal exposure, and after thermal exposure to 310° C. for 90 min.

FIG. 2A thus illustrates an example of the evolution of the electrical resistivity $\rho_{a|r}$ of a base compound made of $VO_{1.8}$ (not containing arsenic, germanium, silicon or phosphorus) as a function of the temperature $T_r$ for a duration $\Delta t_r$ equal to 90 min. The electrical resistivity $\rho_{a|r}$ thus remains constant and equal to approximately 10 $\Omega$·cm up to the temperature $T_r$ of approximately 280° C. It then exhibits a strong decrease, in particular between 300° C. and 325° C.

Moreover, it may be seen that, when the electrical resistivity is degraded following the thermal exposure to $T_r$ for $\Delta t_r$, the temperature coefficient of resistance (TCR) does not experience any significant degradation.

Figure 2B:
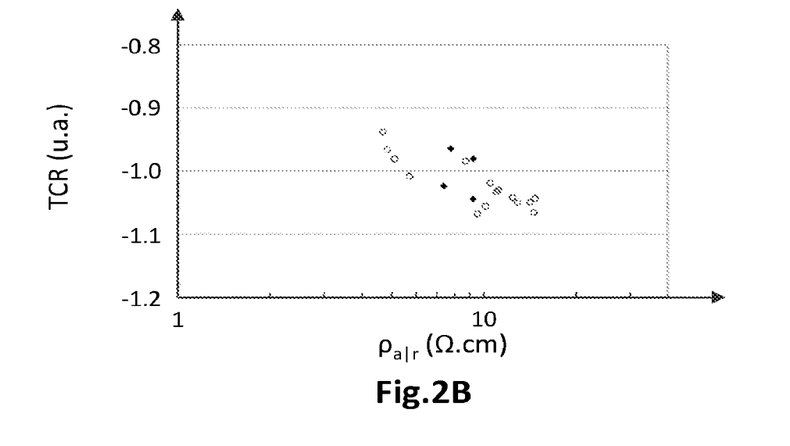

FIG. 2B thus illustrates the values of various measurements of the TCR coefficient (in arbitrary units) of a base compound made of $VO_x$, the electrical resistivity of which is between 5 $\Omega$·cm and 15 $\Omega$·cm, as a function of the electrical resistivity $\rho_{a|r}$ after annealing at 310° C. for a duration $\Delta t_r$ of 90 min (solid diamonds). Values of the TCR coefficient for this same type of $VO_x$ base compound without annealing at the temperature $T_r$ are also indicated (hollow circles). It may be seen that the TCR coefficient of such a $VO_x$ base compound remains substantially constant, this being the case whether or not the base compound has been subjected to thermal exposure at a high temperature $T_r$ of 310° C. The electrical resistivity values indicated in FIG. 2B regarding the $VO_x$ base compounds with annealing (solid diamonds) correspond to the degraded electrical resistivity following annealing. The native values of the electrical resistivity are higher and are not indicated in the figure. In addition, the electrical resistivity values regarding the $VO_x$ base compounds without annealing (hollow circles) correspond to the native electrical resistivity of the corresponding compounds. The degraded values after annealing are lower but are not indicated in the figure.

On the other hand, it may be seen that the 1/f noise associated with this type of $VO_x$ base compound exhibits an increase that is concomitant with the reduction in the electrical resistivity $\rho_{a|r}$ when this is due to the thermal exposure to the temperature $T_r$ for the duration $\Delta t_r$.

Figure 2C:
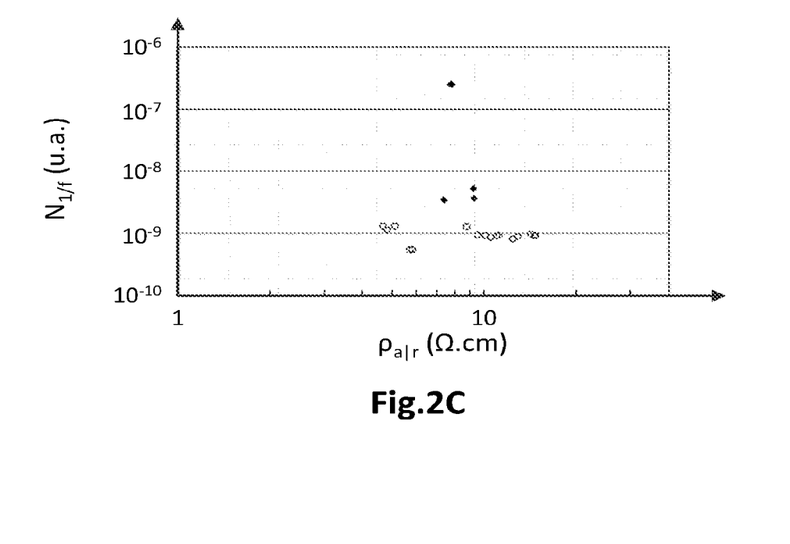

FIG. 2C thus illustrates the values of various measurements of a parameter $N_{1/f}$ representative of the 1/f noise of the $VO_x$ base compounds of FIG. 2B as a function of the electrical resistivity $\rho_{a|r}$ after annealing at 310° C. for a duration $\Delta t_r$ of 90 min (solid diamonds). Values of this 1/f noise parameter for these $VO_x$ base compounds without annealing at the temperature $T_r$ are also indicated (hollow circles). While the 1/f noise remains substantially constant regardless of the value of the electrical resistivity for these $VO_x$ base compounds without annealing at $T_r$ (hollow circles), it may be seen that annealing the $VO_x$ base compounds at a temperature of 310° C. for 90 min causes a significant increase in 1/f noise (solid diamonds).

The parameter $N_{1/f}$ representative of the 1/f noise is estimated here from the spectral analysis of a reference electric current flowing in the sensitive material. To this end, the sensitive material is biased with a direct (DC) voltage source set so as to impose the reference current on the sensitive material. A very low noise voltage source is also used so as not to bias the measurement of the noise of the sensitive material. The reference current is thus marred by the only noise current of the sensitive material. This current is then amplified by a transimpedance amplifier that delivers a voltage output signal that is the image of the input current. The voltage signal is sampled, digitized and processed digitally (Fourier transform) in order to obtain its spectrum. The amplitude of the 1/f noise may be obtained by reading a particular point of the spectrum, for example at 1 Hz, or using a least squares calculation method on the low-frequency part of the spectrum where the manifestation of the 1/f noise is the most pronounced.

It may therefore be seen that exposing an amorphous $VO_x$ base compound having a native electrical resistivity $\rho_a$ at ambient temperature of between 1 $\Omega$·cm and 30 $\Omega$·cm (that is to say non-stoichiometric form) to a temperature $T_r$ for a duration $\Delta t_r$ such that its electrical resistivity $\rho_{a|r}$ drops with respect to its native value $\rho_a$ also causes a degradation of the 1/f noise, without the TCR coefficient otherwise being affected.

This increase in the 1/f noise of such a $VO_x$ base compound may be the result of the onset of crystallization of the compound, in which distinct crystalline phases appear, which differ from one another in terms of the amount of oxygen, these crystalline phases then being stoichiometric forms. Thus, by way of example, the at least partial crystallization of an initially amorphous $VO_x$ base compound, where x is of the order of 1.8, results in the appearance of various stoichiometric crystalline phases, including $VO_2$ and $V_2O_5$ (that is to say x=2.5). The increase in 1/f noise could thus be linked to the appearance of several stoichiometric crystalline phases, differing from one another in terms of the amount of oxygen, and therefore in terms of the loss of the homogeneous character of the chemical composition of the sensitive material, and therefore of its local electrical properties.

Figure 3A:
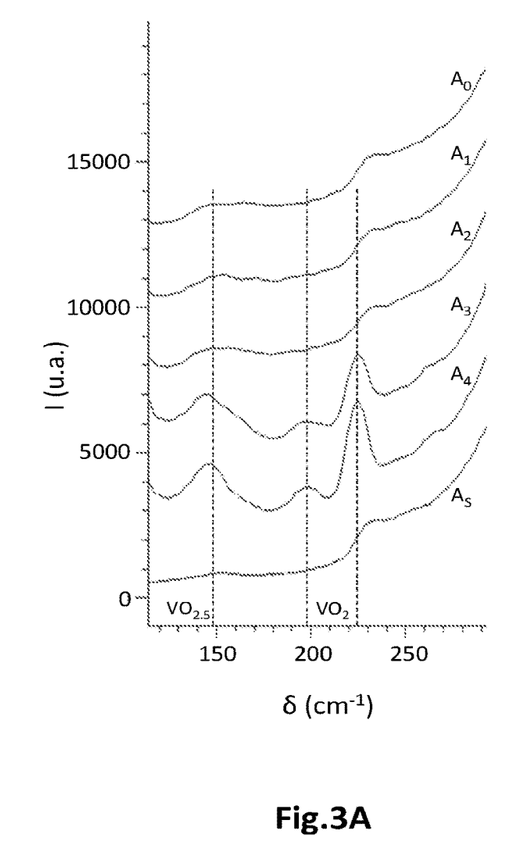
FIGS. 3A and 3B are examples of Raman spectra for VO$_x$ base compounds without thermal exposure, and after thermal exposure for 90 min at various temperatures.
Figure 3B:
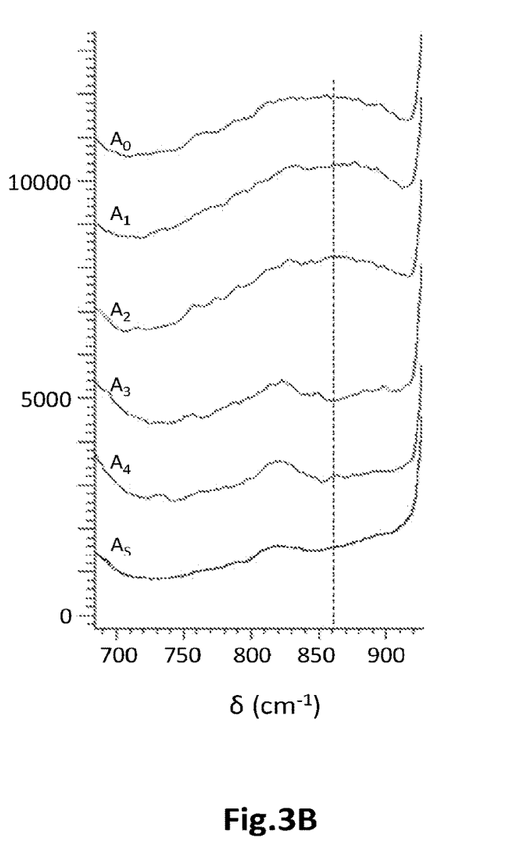

In this respect, FIGS. 3A and 3B illustrate examples of Raman spectra of an initially amorphous $VO_x$ base compound (therefore without As, Ge, Si or P added), where x is equal to approximately 1.85, for various exposures to a temperature $T_r$ for a duration $\Delta t_r$ of 90 min. The Raman spectra of FIG. 3A are centred on a Raman shift range ranging from approximately 100 to 300 $cm^{-1}$, and those of FIG. 3B are centred on a Raman shift range ranging from approximately 700 to 950 $cm^{-1}$. The curve $A_0$ corresponds to the Raman spectrum of a $VO_{1.85}$ compound without annealing, and the curve $A_s$ corresponds to that of the support on which the compound in question rests. The curves $A_1$, $A_2$, $A_3$ and $A_4$ correspond to the Raman spectrum of the $VO_{1.85}$ compound that has undergone exposure for 90 min to temperatures $T_r$ of 300° C., 310° C., 320° C. and 330° C., respectively. It may be seen that the peak at 149 $cm^{-1}$ appears and increases in terms of intensity when the temperature $T_r$ increases, this peak being associated with the stoichiometric crystalline phase $V_2O_5$ (x=2.5). Similarly, the peaks at 197 $cm^{-1}$ and 224 $cm^{-1}$ associated with the stoichiometric crystalline phase $VO_2$ appear and increase in terms of intensity with the temperature $T_r$. Correlatively, the peak at 860 $cm^{-1}$ associated with the amorphous character of the base compound decreases as the temperature $T_r$ increases.

Thus, it appears that the high-temperature exposure of an initially amorphous base compound made from $VO_x$ and not containing any arsenic, germanium, silicon or phosphorus, and whose native electrical resistivity is between 1 Ω·cm and 30 Ω·cm, leads to at least partial crystallization of the sensitive material, which results in a drop in its electrical resistivity and in an increase in 1/f noise. In other words, electrical resistivity at ambient temperature is a parameter representative of the amorphous or non-amorphous character of the compound, as well as of 1/f noise. Therefore, by adding a sufficient amount of arsenic, germanium, silicon or phosphorus to the base compound (or "first compound") as an additional chemical element in order to obtain a modified compound, it is possible to limit the crystallization or even to push back the crystallization threshold of the modified compound, and therefore to limit or even eliminate 1/f noise degradation.

As mentioned above, the manufacturing process then comprises a step of adding an additional chemical element chosen from among arsenic, germanium, silicon and phosphorus to the base compound, so as to obtain a modified compound. The native electrical resistivity is between 0.1 Ω·cm and 30 Ω·cm, which corresponds to a non-stoichiometric amount of oxygen x. The amount of oxygen x in the base compound has not been modified by the addition of the additional chemical element. Thus, if the additional chemical element is arsenic, the amount of arsenic to be added to the base compound is determined such that the compound thus modified, when exposed to the temperature $T_r$ for the duration $\Delta t_r$ determined beforehand, has an electrical resistivity $\rho_{a|r}$ greater than or equal to 10% of its native value. The partial crystallization of the modified compound is thus limited, giving rise to stoichiometric crystalline phases that differ from one another in terms of the amount of oxygen x, and 1/f noise degradation is also limited. The thermal stability of the properties of the sensitive material is thus improved when it is subsequently exposed to the temperature $T_r$ for the duration $\Delta t_r$.

Such a sensitive material is then particularly advantageous in the context of a collective manufacturing process for manufacturing an array of microbolometers of an electromagnetic radiation detection device. Specifically, in a thermal exposure step, the temperature field may exhibit spatial inhomogeneities within a thin-film deposition reactor or an annealing furnace, which may result in a dispersion of the electrical properties of the microbolometers. Thus, by using the sensitive material with a sufficient amount of arsenic, germanium, silicon and/or phosphorus, the microbolometers exhibit better thermal stability during thermal exposure to the temperature $T_r$, thus reducing the dispersion of the electrical properties of the microbolometers.

Moreover, the sensitive material may also comprise a transition metal belonging to period 4 of the periodic table of the elements, that is to say scandium Sc, titanium Ti, chromium Cr, manganese Mn, iron Fe, cobalt Co, nickel Ni, copper Cu and/or zinc Zn. It may also comprise other chemical elements, for example yttrium Y, niobium Nb, molybdenum Mo, tantalum Ta, tungsten W, inter alia.

Figure 4A:
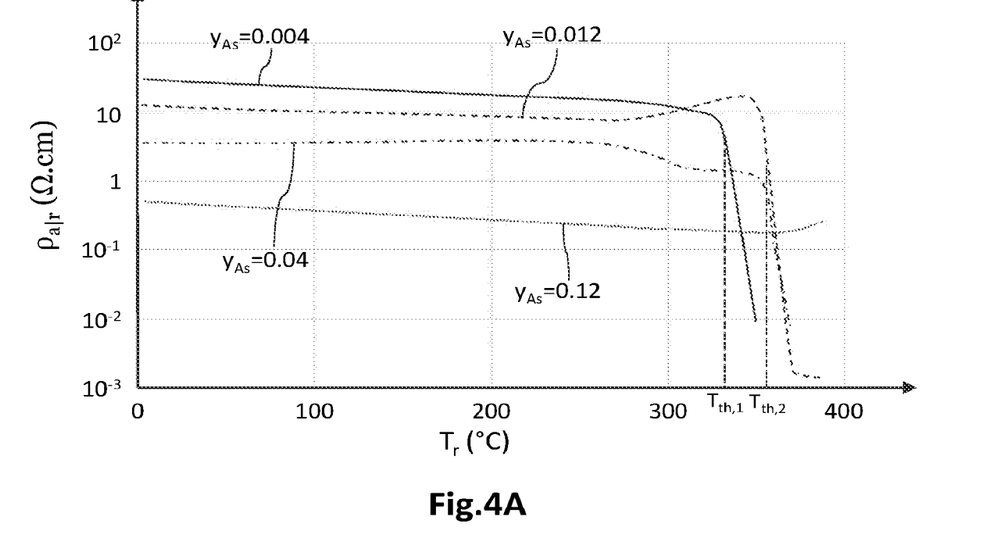
FIGS. 4A to 4D are graphs illustrating the evolution of the electrical resistivity $\rho_{a|r}$ at ambient temperature of the sensitive material based on vanadium oxide, after exposure of said material to a temperature $T_r$ for a duration $\Delta t_r$, for various amounts of an additional chemical element, the latter being arsenic (FIG. 4A), germanium (FIG. 4B), silicon (FIG. 4C), and phosphorus (FIG. 4D).

FIG. 4A illustrates examples of the evolution of the electrical resistivity $\rho_{a|r}$ at ambient temperature of the sensitive material as a function of the thermal exposure temperature $T_r$, for various amounts of arsenic As added to the $VO_x$ first compound for a duration $\Delta t_r$ of 90 min. These examples demonstrate an increase in the thermal stability of the sensitive material when it comprises the effective amount of arsenic.

In these examples, the samples of the $VO_xAs_y$ modified compound of the sensitive material were produced using an ion beam sputtering (IBS) deposition technique for depositing the $VO_x$ first compound, for example by sputtering a vanadium target under an oxidizing atmosphere at a partial oxygen pressure for example of the order of approximately $10^{-4}$ Torr, followed by implanting arsenic into the $VO_x$ first compound. The $VO_xAs_y$ modified compound is thus obtained. Other techniques for producing the $VO_xAs_y$ modified compound may be used. The electrical resistivity $\rho_{a|r}$ of the sensitive material is measured at ambient temperature, here at 30° C., after exposure of the sensitive material to temperatures of 270° C., 310° C., 330° C., 350° C., 370° C. and 390° C. for 90 min. Various amounts y of arsenic were added, namely here 0.004, 0.012, 0.04 and 0.12. In these examples, the amount x of oxygen is equal to 1.9 to within 0.14, and the first compound $VO_{1.9}$ exhibits a native resistivity of approximately 20 Ω·cm.

It may be seen that, for the amount y of arsenic of 0.004, the electrical resistivity $\rho_{a|r}$ drops by a factor of 10 with respect to its native resistivity $\rho_a$ from a first threshold temperature $T_{th,1}$ equal to approximately 330° C. In other words, the electrical resistivity $\rho_{a|r}$ is less than or equal to 10% of the native value $\rho_a$ for y=0.004.

On the other hand, it may be seen that, for the amounts y of arsenic of 0.012, 0.04 and 0.12, at this temperature $T_{th,1}$ equal to 330° C., the electrical resistivity $\rho_{a|r}$ is greater than 10% of the respective native resistivity $\rho_a$. Therefore, starting from y=0.012 of arsenic, which is then the effective amount, the sensitive material exhibits better thermal stability. More precisely:

With regard to the amounts y of arsenic equal to 0.012 and 0.04, it may be seen that the electrical resistivity drops by a factor of 10 with respect to the respective native resistivities $\rho_a$ from a second threshold temperature $T_{th,2}$ equal to approximately 360° C. It is therefore apparent therefrom that adding an amount of arsenic at least equal to 0.012 to the $VO_x$ base compound gives at least approximately 30° C. of additional thermal stability to the sensitive material.

With regard to the amount y of arsenic equal to 0.12, it may be seen that, up to at least 390° C., the electrical resistivity does not drop by a factor of 10 with respect to its native resistivity $\rho_a$. Therefore, adding an amount of arsenic at least equal to 0.12 gives at least approximately 60° C. of additional thermal stability to the sensitive material.

Lastly, it should be noted that adding an amount of arsenic of up to 0.12 to the $VO_x$ base compound leads to a decrease at most by a factor of approximately 60 in the native electrical resistivity of the $VO_xAs_{y \leq 0.12}$ modified compound with respect to the native resistivity of 20 Ω·cm of the $VO_{1.9}$ base compound. Thus, the native electrical resistivity goes from 20 Ω·cm for $VO_{1.9}$ to 0.49 Ω·cm for $VO_{1.9}As_{0.12}$. In addition, for a temperature $T_r$ between the ambient temperature and 390° C., the electrical resistivity $\rho_{a|r}$ of a $VO_{1.9}As_{0.12}$ modified compound remains greater than or equal to 0.18 Ω·cm.

It is therefore apparent that an amount y of arsenic greater than or equal to 0.012, and preferably greater than or equal to 0.12, gives greater thermal stability to the sensitive material, in terms of electrical resistivity and therefore in terms of 1/f noise. The thermal stability is here improved by 30° C. when y is equal to 0.012 and 0.04, and by at least 60° C. in the case that y=0.12. In addition, it is advantageous for the additional chemical element to be arsenic in that it leads to the decrease in the electrical resistivity of the sensitive material with respect to that of the $VO_{1.9}$ base compound being limited.

Lastly, it may be seen that the modified compound $VO_xAs_{0.12}$ exhibits a particularly small relative variation in the electrical resistivity $\rho_{a|r}$ as a function of the temperature $T_r$, up to at least 390° C. This then makes it possible to limit the dispersion of electrical properties of the microbolometers resulting from any spatial inhomogeneities in the temperature field within the deposition reactor or the annealing furnace.

Figure 4B:
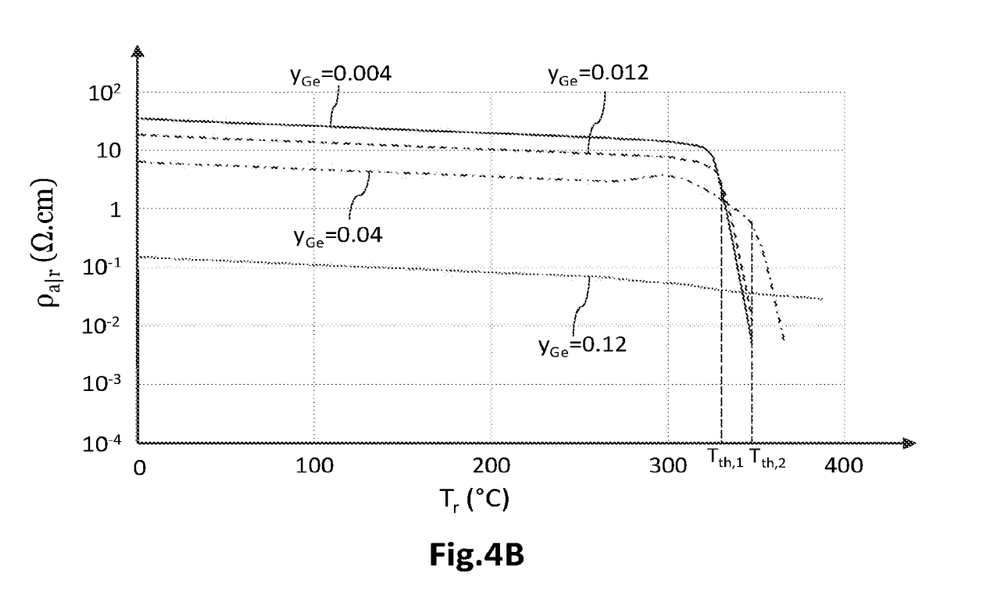

FIG. 4B illustrates examples of the evolution of the electrical resistivity $\rho_{a|r}$ at ambient temperature of the sensitive material as a function of the thermal exposure temperature $T_r$, for various amounts of germanium Ge added to the $VO_x$ first compound for a duration $\Delta t_r$ of 90 min. These examples demonstrate an increase in the thermal stability of the sensitive material when it comprises the effective amount of germanium.

In these examples, the samples of the $VO_xGe_y$ sensitive material are obtained in a manner similar to that described above, that is to say by implanting germanium into a $VO_x$ material obtained beforehand by IBS sputtering. The amount x of oxygen is here equal to 1.9 to within 0.14, which corresponds to a native electrical resistivity of the first compound $VO_{1.9}$ equal to 20 Ω·cm.

It may be seen that, for the amounts y of germanium of 0.004 and 0.012, the electrical resistivity $\rho_{a|r}$ drops by a factor of 10 with respect to its native resistivity $\rho_a$ from a first threshold temperature $T_{th,1}$ equal to approximately 330° C.

On the other hand, it may be seen that, for the amounts y of germanium of 0.04 and 0.12, at this temperature $T_{th,1}$ equal to 330° C., the electrical resistivity $\rho_{a|r}$ is greater than 10% of its native resistivity $\rho_a$. Therefore, starting from y=0.04 of germanium, which is then the effective amount, the sensitive material exhibits better thermal stability. More precisely:

With regard to the amount y=0.04 of germanium, the electrical resistivity drops by a factor of 10 with respect to the corresponding native resistivities $\rho_a$ from a second threshold temperature $T_{th,2}$ equal to approximately 350° C. It is therefore apparent therefrom that adding an amount of germanium at least equal to 0.04 to the $VO_x$ base compound gives at least approximately 20° C. of additional thermal stability to the sensitive material.

With regard to the amount y=0.12 of germanium, up to at least 390° C., the electrical resistivity does not drop by a factor of 10 with respect to its native resistivity $\rho_a$. Therefore, adding an amount of germanium at least equal to 0.12 gives at least approximately 60° C. of additional thermal stability to the sensitive material.

It is therefore apparent that an amount y of germanium greater than or equal to 0.04, and preferably greater than or equal to 0.12, gives greater thermal stability to the sensitive material, in terms of electrical resistivity and therefore in terms of 1/f noise. The thermal stability is here improved by 20° C. for y=0.04, and by at least 60° C. for y=0.12.

Lastly, it may be seen that the modified compound $VO_xGe_{0.12}$ exhibits a particularly small relative variation in the electrical resistivity $\rho_{a|r}$ as a function of the temperature $T_r$, up to at least 390° C. This then makes it possible to limit the dispersion of electrical properties of the microbolometers resulting from any spatial inhomogeneities in the temperature field within the deposition reactor or the annealing furnace.

Figure 4C:
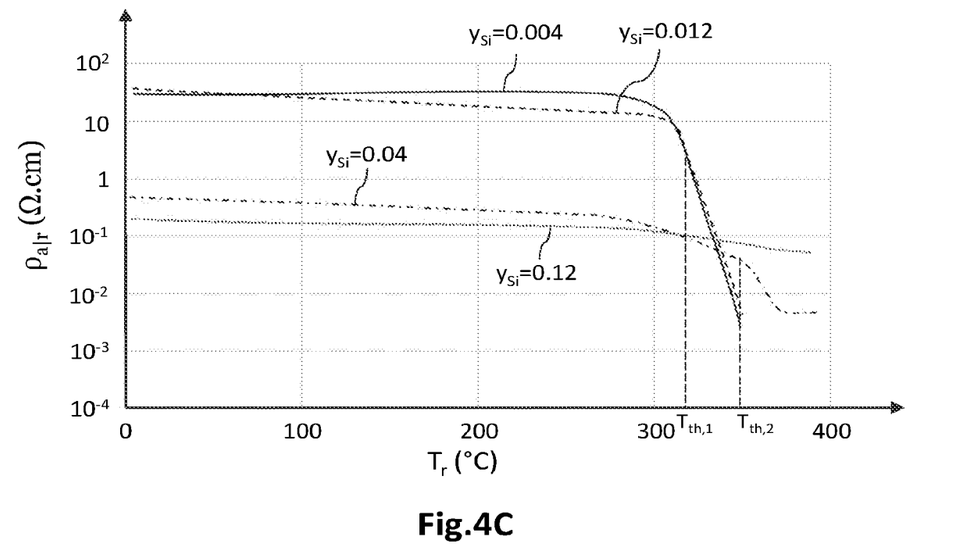

FIG. 4C illustrates examples of the evolution of the electrical resistivity $\rho_{a|r}$ at ambient temperature of the sensitive material as a function of the thermal exposure temperature $T_r$, for various amounts of silicon Si added to the $VO_x$ first compound for a duration $\Delta t_r$ of 90 min. These examples demonstrate an increase in the thermal stability of the sensitive material when it comprises the effective amount of silicon.

In these examples, the samples of the $VO_xSi_y$ sensitive material are obtained in a manner similar to that described above, that is to say by implanting silicon into a $VO_x$ material obtained beforehand by IBS sputtering. The amount x of oxygen is here equal to 1.9 to within 0.14, which corresponds to a native electrical resistivity of the first compound $VO_{1.9}$ equal to 20 Ω·cm.

It may be seen that, for the amounts y of silicon of 0.004 and 0.012, the electrical resistivity $\rho_{a|r}$ drops by a factor of 10 with respect to its native resistivity $\rho_a$ from a first threshold temperature $T_{th,1}$ equal to approximately 315° C.

On the other hand, it may be seen that, for the amounts y of silicon of 0.04 and 0.12, at this temperature $T_{th,1}$ equal to 315° C., the electrical resistivity $\rho_{a|r}$ is greater than 10% of its native resistivity $\rho_a$. Therefore, starting from y=0.04 of silicon, which is then the effective amount, the sensitive material exhibits better thermal stability. More precisely:

With regard to the amount y=0.04 of silicon, the electrical resistivity drops by a factor of 10 with respect to the corresponding native resistivities $\rho_a$ from a second threshold temperature $T_{th,2}$ equal to approximately 350° C. It is therefore apparent therefrom that adding an amount of silicon at least equal to 0.04 to the $VO_x$ base compound gives at least approximately 35° C. of additional thermal stability to the sensitive material.

With regard to the amount y=0.12 of silicon, up to at least 390° C., the electrical resistivity does not drop by a factor of 10 with respect to its native resistivity $\rho_a$. Therefore, adding an amount of silicon at least equal to 0.12 gives at least approximately 75° C. of additional thermal stability to the sensitive material.

It is therefore apparent that an amount y of silicon greater than or equal to 0.04, and preferably greater than or equal to 0.12, gives greater thermal stability to the sensitive material, in terms of electrical resistivity and therefore in terms of 1/f noise. The thermal stability is here improved by 35° C. for y=0.04, and by at least 75° C. for y=0.12.

Lastly, it may be seen that the modified compound $VO_xSi_{0.12}$ exhibits a particularly small relative variation in the electrical resistivity $\rho_{a|r}$ as a function of the temperature $T_r$, up to at least 390° C. This then makes it possible to limit the dispersion of electrical properties of the microbolometers resulting from any spatial inhomogeneities in the temperature field within the deposition reactor or the annealing furnace.

Figure 4D:
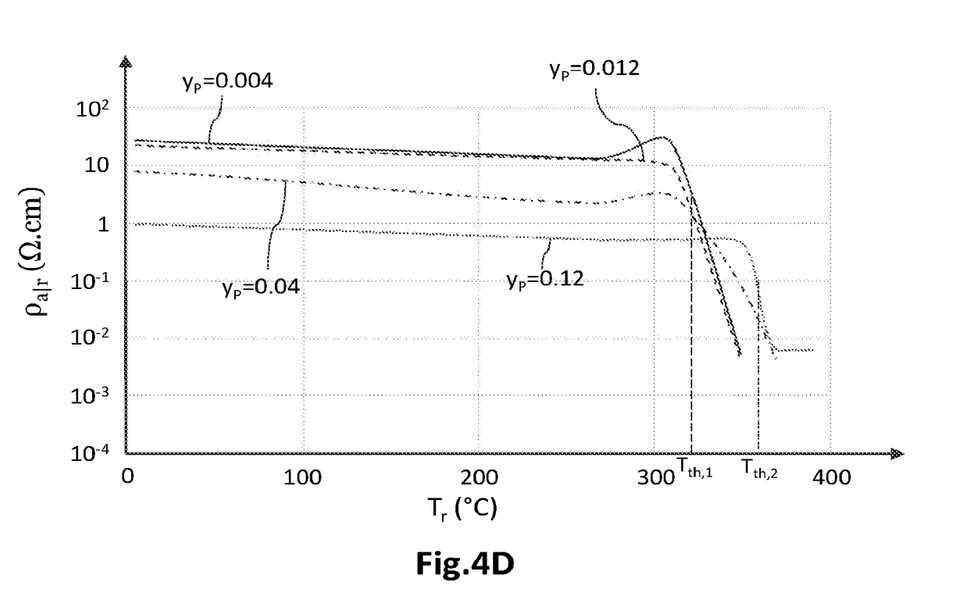

FIG. 4D illustrates examples of the evolution of the electrical resistivity $\rho_{a|r}$ at ambient temperature of the sensitive material as a function of the thermal exposure temperature $T_r$, for various amounts of phosphorus P added to the $VO_x$ first compound for a duration $\Delta t_r$ of 90 min. These examples demonstrate an increase in the thermal stability of the sensitive material when it comprises the effective amount of phosphorus.

In these examples, the samples of the $VO_xP_y$ sensitive material are obtained in a manner similar to that described above, that is to say by implanting phosphorus into a $VO_x$ material obtained beforehand by IBS sputtering. The amount x of oxygen is here equal to 1.9 to within 0.14, which corresponds to a native electrical resistivity of the first compound $VO_{1.9}$ equal to 20 Ω·cm.

It may be seen that, for the amounts y of phosphorus of 0.004, 0.012 and 0.04, the electrical resistivity $\rho_{a|r}$ drops by a factor of 10 with respect to its native resistivity $\rho_a$ from a first threshold temperature $T_{th,1}$ equal to approximately 320° C.

On the other hand, it may be seen that, for the amount y of phosphorus of 0.12, at this temperature $T_{th,1}$ equal to 320° C., the electrical resistivity $\rho_{a|r}$ is greater than 10% of its native resistivity $\rho_a$. Therefore, starting from y=0.12 of phosphorus, which is then the effective amount, the sensitive material exhibits better thermal stability.

More precisely, with regard to the amount y=0.12 of phosphorus, the electrical resistivity drops by a factor of 10 with respect to the corresponding native resistivities $\rho_a$ from a second threshold temperature $T_{th,2}$ equal to approximately 360° C. It is therefore apparent therefrom that adding an amount of phosphorus at least equal to 0.12 to the $VO_x$ base compound gives at least approximately 40° C. of additional thermal stability to the sensitive material, in terms of electrical resistivity and therefore in terms of 1/f noise.

Therefore, the additional chemical element is chosen from among arsenic, germanium, silicon and phosphorus. However, it is preferably chosen from among arsenic, germanium, and silicon, given that these three chemical elements allow the thermal stability of the sensitive material to be increased to at least 390° C., which is not the case with phosphorus. This is all the more surprising considering that these four chemical elements form part, with boron, of the chemical elements that form glassy networks, that is to say that they form part of the chemical elements of which an oxide may form by itself (without any other addition) a stable amorphous material. The oxides of the network formers are $SiO_2$ for silicon, $P_2O_5$ for phosphorus, $GeO_2$ for germanium, and $As_2O_3$ for arsenic. Still, it is surprising that, from among this family of network formers, arsenic, germanium and silicon allow better thermal stability to be obtained than phosphorus. Incidentally, it might have been thought that silicon and phosphorus would have been equally effective chemical elements with respect to one another given that they are, like boron, smaller ions than arsenic and germanium. Still, it appears that, surprisingly, phosphorus is less effective than silicon. Therefore, the additional chemical element is preferably chosen from among arsenic, germanium and silicon.

Particular embodiments have just been described. Various modifications and variants will be apparent to a person skilled in the art.

The invention claimed is:

1. A process for manufacturing at least one microbolometer, the process comprising:
    producing a sensitive material in a thin layer, the sensitive material comprising a first compound comprising vanadium oxide and an additional chemical element, added to the first compound, the additional chemical element comprises arsenic, germanium, silicon, and/or phosphorus, and the additional chemical element comprising no nitrogen;
    exposing the sensitive material to a temperature $T_r$ greater than ambient temperature for a duration $\Delta t_r$, performed after the producing, the temperature $T_r$ and the duration $\Delta t_r$ being such that the first compound, being amorphous and having a native electrical resistivity value at ambient temperature in a range of from 1 to 30 Ω·cm, having undergone exposure to the temperature $T_r$ for the duration $\Delta t_r$, has an electrical resistivity at ambient temperature less than or equal to 10% of its native value;
    determining a non-zero amount of the additional chemical element, referred to as an effective amount, added to the first compound, thus forming a modified compound, starting from which the modified compound, having undergone exposure to the temperature $T_r$ for the duration $\Delta t_r$, has an electrical resistivity Par at ambient temperature greater than 10% of its native value $\rho_a$;
    wherein the producing comprises forming the thin layer of the modified compound having an amount of the additional chemical element(s) greater than or equal to the effective amount determined beforehand, the sensitive material being amorphous, having a native electrical resistivity value Pa at ambient temperature in a range of from 0.1 to 30 Ω·cm, and a homogeneous chemical composition;
    such that, following the exposing, the sensitive material then has a noise whose degradation has been limited,
    wherein the microbolometer comprises the sensitive material,
    wherein the process allows noise degradation associated with the sensitive material to be limited.

2. The process of claim 1, wherein the additional chemical element is selected from the group consisting of arsenic, germanium, and silicon.

3. The process of claim 1, wherein the exposing comprises depositing a protective layer, covering the sensitive material.

4. The process of claim 1, wherein the exposing comprises depositing an encapsulation layer, transparent to the electromagnetic radiation, to be detected and intended to define a cavity in which the microbolometer is located.

5. The process of claim 1, wherein the temperature $T_r$ is at least 330° C.

6. The process of claim 1, wherein the duration $\Delta t_r$ is at least 90 min.

7. The process of claim 1, wherein the sensitive material is produced at a temperature less than the temperature $T_r$.

8. The process of claim 1, the additional chemical element comprises arsenic.

9. The process of claim 1, the additional chemical element comprises germanium.

10. The process of claim 1, the additional chemical element comprises silicon.

11. The process of claim 1, wherein the temperature $T_r$ is in a range of from 345° C. to 355° C.

12. The process of claim 1, wherein the additional chemical element is selected from the group consisting of arsenic, germanium, and silicon, and
wherein the exposing comprises depositing a protective layer, covering the sensitive material.

13. The process of claim 1, wherein the additional chemical element is selected from the group consisting of arsenic, germanium, and silicon, and
wherein the exposing comprises depositing an encapsulation layer, transparent to the electromagnetic radiation, to be detected and intended to define a cavity in which the microbolometer is located.

14. A microbolometer, comprising:
a sensitive material comprising a first compound, comprising vanadium oxide, and an additional chemical element comprising arsenic, germanium, silicon, and/or phosphorus, and excluding nitrogen,
wherein the sensitive material is amorphous,
wherein the sensitive material has an electrical resistivity at ambient temperature in a range of from 0.1 to 30 Ω·cm,
wherein the sensitive material has a homogeneous chemical composition, and
wherein the sensitive material comprises an amount of the additional chemical element, defined as a ratio of a number of atoms of the additional chemical element to a number of atoms of vanadium, at least 0.012 in case of arsenic, at least 0.04 in case of germanium and silicon, and at least 0.12 in case of phosphorus.

15. The microbolometer of claim 14, comprising an amount of oxygen, defined as a ratio of a number of oxygen atoms to a number of vanadium atoms, is in a range of from 1.42 to 1.94.

16. The microbolometer of claim 14, wherein the sensitive material is covered by a protective layer comprising silicon nitride.

17. A device configured for detecting electromagnetic radiation, the device comprising:
more than one of the microbolometer of claim 14, as an array of microbolometers,
wherein the microbolometers are arranged in at least one hermetic cavity delimited by an encapsulation structure transparent to the electromagnetic radiation to be detected, the encapsulation structure comprising a layer comprising amorphous silicon.

18. A detection device of claim 17, comprising:
a getter material located in the hermetic cavity.

19. The microbolometer of claim 14, comprising an amount of oxygen, defined as a ratio of a number of oxygen atoms to a number of vanadium atoms, is in a range of from 1.37 to 1.99.

20. The microbolometer of claim 14, comprising an amount of oxygen, defined as a ratio of a number of oxygen atoms to a number of vanadium atoms, is in a range of from 1.47 to 1.89.

* * * * *

UNITED STATES PATENT AND TRADEMARK OFFICE
CERTIFICATE OF CORRECTION

| | | |
|---|---|---|
| PATENT NO. | : 12,066,332 B2 | Page 1 of 1 |
| APPLICATION NO. | : 17/629995 | |
| DATED | : August 20, 2024 | |
| INVENTOR(S) | : Denis Pelenc et al. | |

It is certified that error appears in the above-identified patent and that said Letters Patent is hereby corrected as shown below:

On the Title Page

Item (71), the Applicant is incorrect. Item (71) should read:
- (71) Applicant: COMMISSARIAT À L'ENERGIE ATOMIQUE ET AUX ENERGIES ALTERNATIVES, Paris (FR); LYNRED, Palaiseau (FR) -

Signed and Sealed this
Fifteenth Day of October, 2024

Katherine Kelly Vidal
*Director of the United States Patent and Trademark Office*